United States Patent
McAndrew et al.

(10) Patent No.: US 8,298,965 B2
(45) Date of Patent: Oct. 30, 2012

(54) VOLATILE PRECURSORS FOR DEPOSITION OF C-LINKED SICOH DIELECTRICS

(75) Inventors: James J. F. McAndrew, Chadds Ford, PA (US); Francois Doniat, Wilmington, DE (US)

(73) Assignee: American Air Liquide, Inc., Fremont, CA (US)

( * ) Notice: Subject to any disclaimer, the term of this patent is extended or adjusted under 35 U.S.C. 154(b) by 415 days.

(21) Appl. No.: 12/553,843

(22) Filed: Sep. 3, 2009

(65) Prior Publication Data

US 2010/0052115 A1    Mar. 4, 2010

Related U.S. Application Data

(60) Provisional application No. 61/093,962, filed on Sep. 3, 2008.

(51) Int. Cl.
*H01L 21/31* (2006.01)
(52) U.S. Cl. ........ 438/781; 438/778; 438/780; 438/786; 438/790
(58) Field of Classification Search .................. 438/778, 438/780, 781, 786, 790; 427/489
See application file for complete search history.

(56) References Cited

U.S. PATENT DOCUMENTS

| | | | |
|---|---|---|---|
| 5,989,998 A | 11/1999 | Sugahara et al. |
| 6,159,871 A | 12/2000 | Loboda et al. |
| 6,312,793 B1 | 11/2001 | Grill et al. |
| 6,479,110 B2 | 11/2002 | Grill et al. |
| 6,583,048 B1 | 6/2003 | Vincent et al. |
| 6,756,323 B2 | 6/2004 | Grill et al. |
| 6,846,515 B2 | 1/2005 | Vrtis et al. |
| 6,953,984 B2 | 10/2005 | Grill et al. |
| 7,030,468 B2 | 4/2006 | Gates et al. |
| 7,049,247 B2 | 5/2006 | Gates et al. |
| 7,087,271 B2 | 8/2006 | Rhee et al. |
| 7,202,564 B2 | 4/2007 | Nguyen et al. |
| 7,229,934 B2 | 6/2007 | Dubois et al. |
| 7,241,704 B1 | 7/2007 | Wu et al. |
| 7,256,139 B2 | 8/2007 | Moghadam et al. |
| 7,282,458 B2 | 10/2007 | Gates et al. |
| 7,288,292 B2 | 10/2007 | Gates et al. |
| 7,312,524 B2 | 12/2007 | Gates et al. |
| 7,384,471 B2 | 6/2008 | Vrtis et al. |
| 7,390,537 B1 | 6/2008 | Wu et al. |
| 7,479,191 B1 | 1/2009 | Entley et al. |
| 7,491,658 B2 | 2/2009 | Nguyen et al. |
| 7,500,397 B2 | 3/2009 | Weigel et al. |
| 7,521,377 B2 | 4/2009 | Gates et al. |
| 2005/0196974 A1 | 9/2005 | Weigel et al. |
| 2005/0260420 A1 | 11/2005 | Collins et al. |
| 2006/0079099 A1 | 4/2006 | Nguyen et al. |
| 2006/0165891 A1 | 7/2006 | Edelstein et al. |
| 2007/0057235 A1 | 3/2007 | Teff et al. |
| 2008/0265381 A1 | 10/2008 | Afzali-Ardakani et al. |
| 2009/0017231 A1 | 1/2009 | Yim et al. |
| 2009/0136667 A1 | 5/2009 | Deval et al. |

FOREIGN PATENT DOCUMENTS

| | | |
|---|---|---|
| JP | 2007 221039 | 8/2007 |
| JP | 2007 318067 | 12/2007 |
| WO | WO 2006 136741 | 12/2006 |
| WO | WO 2007 113104 | 10/2007 |

OTHER PUBLICATIONS

Gates, S. et al. "Integration Compatible Porous SiCOH Dielectrics from 45 to 22 nm", data from Advanced Metallization Conference in 2008, pp. 68-69.
"The International Technology Roadmap for Semiconductors", 2007, Interconnect.
Loy, D.A. et al. "Bridged Polysilsesquioxanes. Highly Porous Hybrid Organic-Inorganic Materials", Chem Rev (1995) 95, pp. 1431-1442.
O'Neill, M.L. et al. "Impact of Pore Size and Morphology of Porous Organosilicate Glasses on Integrated Circuit Manufacturing", 2006 Materials Research Society Symposium Proceedings, vol. 914.
Dubois, G. et al., "Molecular network reinforcement of sol-gel glasses," Advanced Materials 19 (22), Nov. 2007, pp. 3989-3994.
Kim, S. et al., "Organosilicate spin-on glasses. I. Effect of chemical modification on mechanical properties," Journal of the Electrochemical Society, 151 (3), 2004, pp. F37-F44.
Lu, Y. et al., "Evaporation-induced self-assembly of hybrid bridged silsesquioxane film and particulate mesophases with integral organic functionality," J. Am. Chem. Soc., 122 (22), 2000, pp. 5258-5261.
Oh, T. et al., "Chemical shift determined according to flow rate ratio $O_2$/BTMSM by Fourier Transform Infrared spectra and x-ray photoelectron spectroscopy," Japanese Journal of Applied Physics, 42, 2003, pp. 6292-6295.
Sugahara, S. et al., "A proposed organic-silica film for inter-metal-dielectric application," Japanese Journal of Applied Physics, 38, 1999, pp. 1428-1432.
Sugahara, S. et al., "Preparation and characterization of low-k silica film incorporated with methylene groups," Journal of the Electrochemical Society, 148 (6), 2001, pp. F120-F126.

*Primary Examiner* — Thanh V Pham
(74) *Attorney, Agent, or Firm* — Patricia E. McQueeney

(57) ABSTRACT

Disclosed herein are precursors and methods for their use in the manufacture of semiconductor, photovoltaic, TFT-LCD, or flat panel type devices.

8 Claims, 5 Drawing Sheets

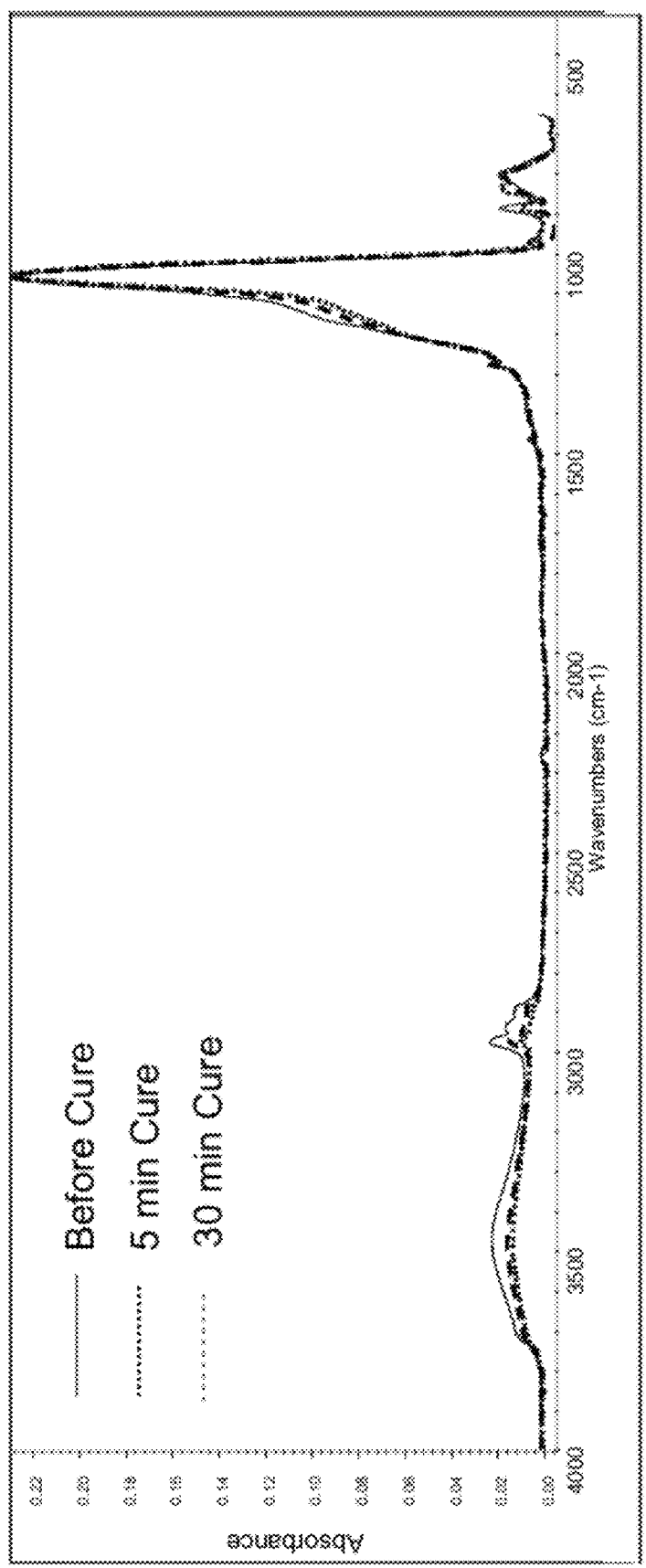

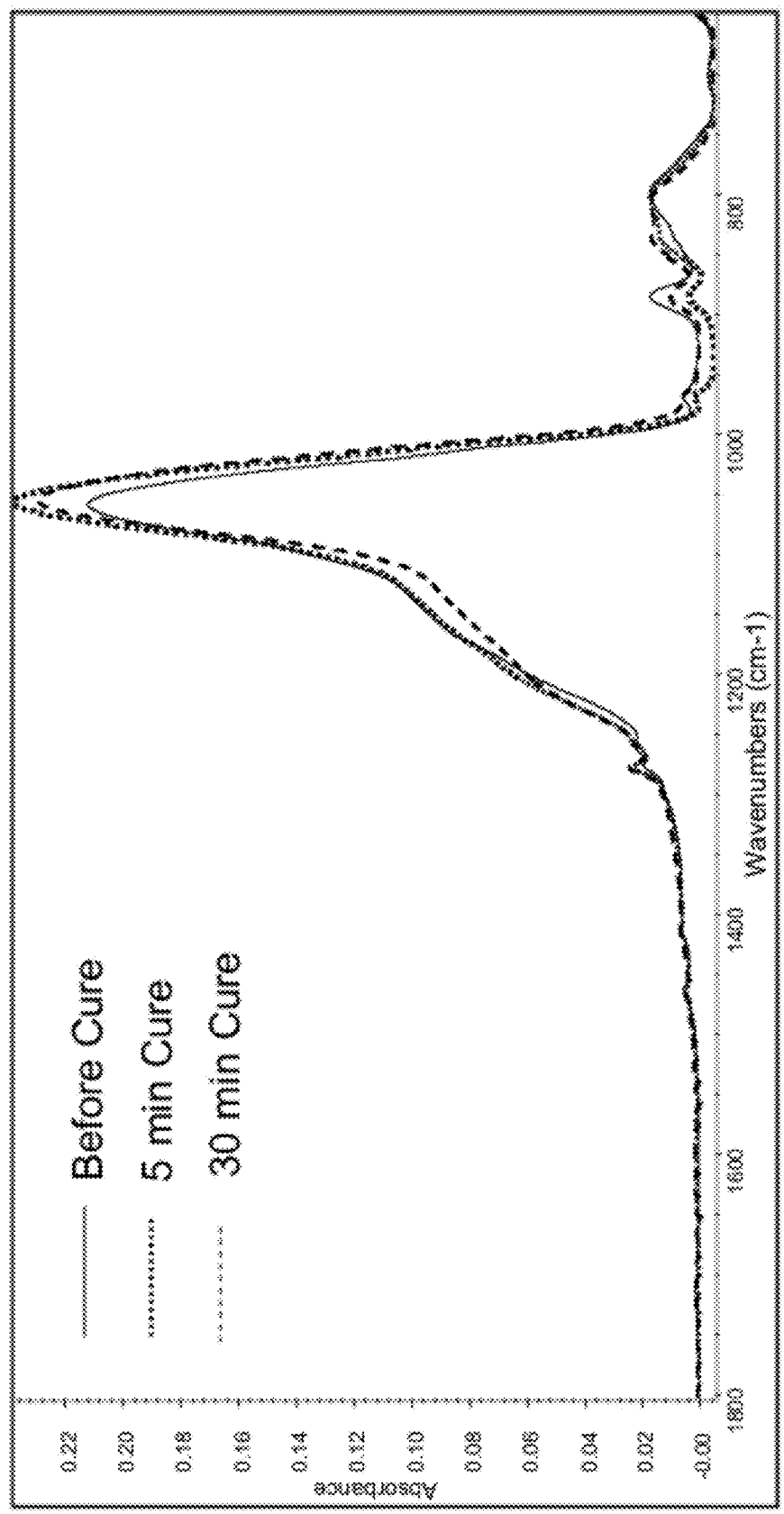

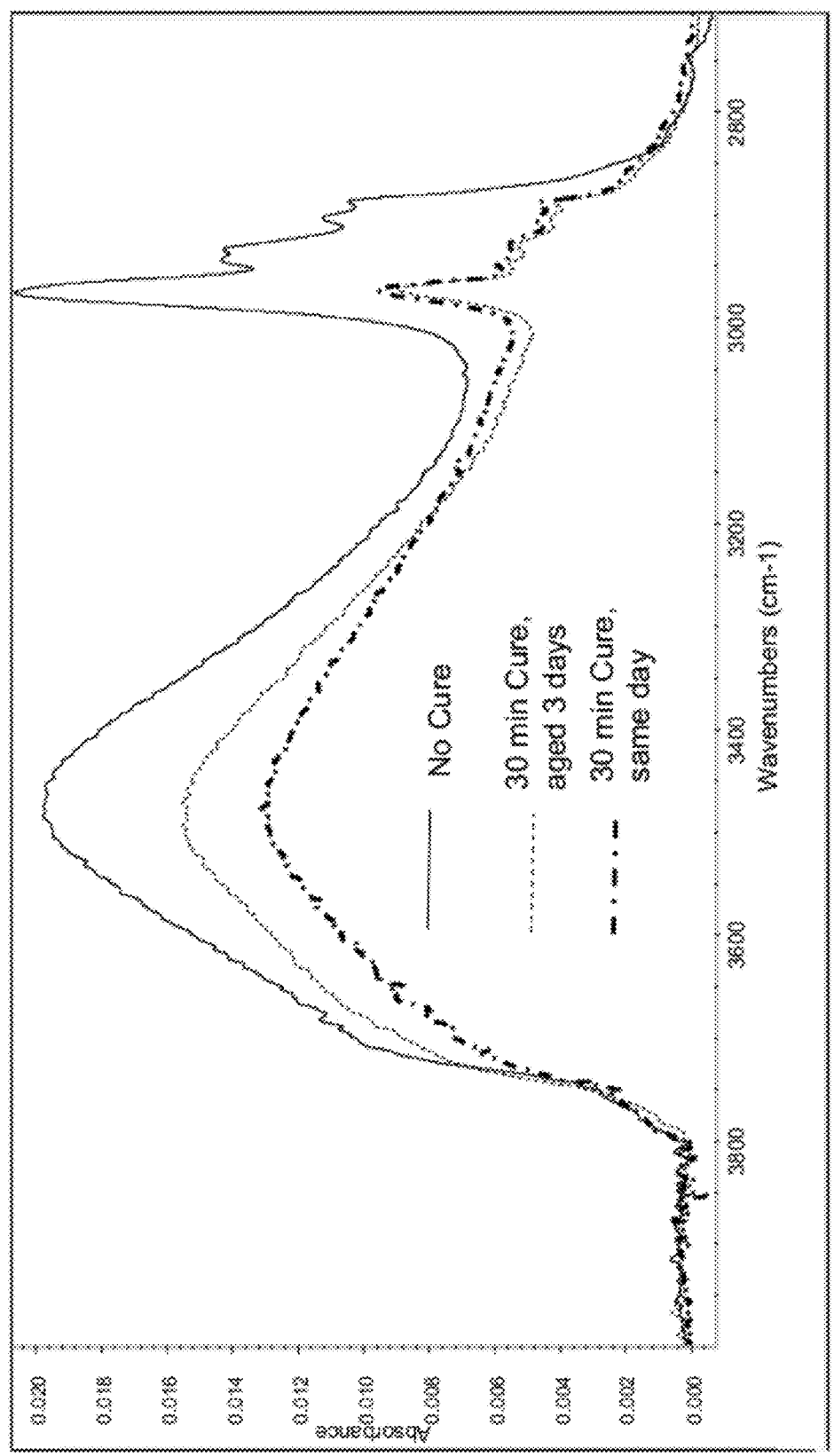

VOLATILE PRECURSORS FOR DEPOSITION OF C-LINKED SICOH DIELECTRICS

CROSS REFERENCE TO RELATED APPLICATIONS

The present application claims the benefit of U.S. Provisional Application Ser. No. 61/093,962 filed Sep. 3, 2008, herein incorporated by reference in its entirety for all purposes.

BACKGROUND

The benefits in speed and device density that can be obtained by reducing dimensions in integrated circuits (ICs) tend to be negated by increases in interconnect delay. This is the driving force behind the adoption of copper, which reduces resistivity, and lower-dielectric constant insulators, which reduce capacitance.

The formerly-used dielectric, $SiO_2$ (silicon dioxide), has been replaced by SiOF (fluorine-doped silicon oxide), SiCOH ("carbon-doped oxide"—which adds organic groups such as —$CH_3$ to the $SiO_2$ network) and most recently porous SiCOH, also or pSiCOH. pSiCOH films may be deposited by liquid-phase or gas-phase methods.

SiOF and SiCOH reduce the dielectric constant of $SiO_2$ by replacing some Si—O—Si linkages by Si—F or Si—$CH_3$ (respectively). This introduces small voids (less than 1 nm in size) into the structure, reducing its overall polarizability and hence dielectric constant. As is well-known, the dielectric constants of air and most gases are very close to that of a vacuum, namely 1.0, so that introduction of voids reduces the overall dielectric constant below that of $SiO_2$ (k=3.9). pSiCOH works in a similar fashion, introducing larger voids (approximately 1-5 nm) for further reduction in dielectric constant. This is typically accomplished by using a sacrificial "porogen" which is added during formation of the dielectric films and subsequently removed to form voids.

Although providing the desired reduction in dielectric constant, porous dielectrics are much more difficult to integrate into semiconductor manufacturing because their porosity causes a deterioration in mechanical properties. This creates problems in processes such as chemical mechanical polishing (CMP), during which low-k dielectrics can be easily cracked, and in packaging (i.e. final assembly ICs), where significant mechanical forces are applied to chips. In addition, the presence of pores allows reactive species to penetrate deep into the dielectric during subsequent processing steps, especially if the pores are interconnected. Reactive species can damage the low-k dielectric or contaminate it with undesired elements, such as metals.

One example of attack by reactive species is the conversion of Si—$CH_3$ within the low-k film to Si—OH due to reaction with oxidizers. Si—OH groups are known to increase uptake of water into the low-k film. As liquid water has a dielectric constant of ~80, even a small amount of water can lead to a dramatic increase in the dielectric constant. In addition, conversion of hydrophobic Si—$CH_3$ groups to hydrophilic Si—OH leaves the film more vulnerable to attack by aqueous acids, which are used, for example, in cleaning steps. This can lead to an increase in the dimensions of a feature that is etched in a low-k dielectric film, then subsequently cleaned by dilute aqueous acids. As can easily be understood, any increase to the dimensions is very undesirable in the context of the overall drive to reduce feature size.

The difficulties of integrating low-k dielectrics into semiconductor manufacture have lead many manufacturers to avoid or postpone their implementation as long as possible. Comparison of the projections of the International Technology Roadmap for Semiconductors, 2007 edition, with actual manufacturing practice shows that low-k implementation is many years behind the schedule that was originally envisioned. As other solutions become exhausted, the need for implementation of low-k only grows.

There is therefore a need for improved low-k dielectrics that provide improved mechanical properties and improved resistance to reactive species.

pSiCOH films can be deposited by both gas and liquid phase methods. Although some liquid phase methods have entered into commercial production, the majority of films are deposited by gas phase methods, especially plasma-enhanced chemical vapor deposition (PECVD). PECVD is commercially successful largely because it uses equipment designs and know-how accumulated through years of experience on $SiO_2$ and SiOF. Therefore it is particularly desirable to provide improved low-k dielectrics that can be deposited by PECVD.

Although less commercially successful, liquid-phase deposition methods do have certain advantages. Among those advantages is the relative ease of designing precursor molecules that incorporate desired properties into their molecular structure. As the liquid phase deposition process is relatively "gentle," the structural characteristics of the molecule tend to be incorporated into the film. Under plasma conditions typically used for PECVD of low-k films, the plasma energy is sufficiently high that the structure of the precursor molecule is not preserved in the deposited film, but yet not high enough to eliminate the differences between films deposited using different precursors. Thus it is difficult to predict which precursor will deliver the desired film properties. Even apparently closely related precursors may result in very different films. Another aspect of PECVD is that it requires precursors that are sufficiently volatile for easy delivery to the deposition chamber.

Although it is widely believed that carbon linkages, i.e. replacing Si—O—Si with Si—$[CH_2]_n$—Si, improves mechanical properties of low-k films, identification of the most advantageous precursors has not been pursued to the extent necessary to predict the most effective solutions. While an understanding of this issue for films deposited from the liquid phase has been in place for some time—see for example an early review by Loy and Shea (Chem. Rev. 95 1431-1442 (1995))—similar understanding of films deposited by PECVD has yet to be developed. It is well known that films deposited by PECVD are much less ordered than can be achieved from the liquid phase and therefore their mechanical properties are not easy to predict.

The PECVD of pSiCOH films has been extensively studied and discussed by many authors and inventors. As summarized in, for example, U.S. Pat. No. 7,384,471 ("Vrtis"). The usual procedure is deposition of a hybrid film from an organosilicon precursor and an organic compound referred to as a "porogen". The hybrid film is subsequently thermally treated, usually with accompanying exposure to ultraviolet light, to cause a major fraction of organic component to escape the film as gaseous species, forming pores. The thermal/uv treatment also increases cross-linking of the organosilane backbone, which improves mechanical properties. Alternative treatments such as e-beam curing, microwave curing and laser curing have also been extensively studied.

In contrast to non-porous SiCOH films (with k~2.7 or greater), where several precursors have been successfully implemented, implementation of pSiCOH (at k=2.5 and lower) has been much more limited, and few precursors have been successful.

In U.S. Pat. No. 6,583,048, Vincent et al. argue that diethoxymethylsilane (DEMS) is a superior precursor for deposition of SiCOH films (without porogen), citing a Young's Modulus of 16.5 GPa achieved for a film with k=2.90. Vincent et al. cite other precursor examples which achieve lower Young's Moduli at comparable k, namely 8.76 GPa at k=2.85 for trimethylsilane and 6.68 GPa at k=2.88 for dimethyldimethoxysilane.

Vrtis presents Young's Moduli measurements for porous pSiCOH films deposited using DEMS and alpha terpinene (ATP). A modulus of 3.2 GPa was reported for a film with k=2.41. This value of Young's Modulus is substantially lower than is desirable for robust integration of the low-k film. Lower values of k were reported using di-t-butoxymethylsilane with ATP, but low Young's Moduli were again obtained (2.2 GPa at k=2.10 and 3.4 GPa at k=2.19).

Grill et al (U.S. Pat. No. 6,312,793) describe the use of cyclic organosilanes such as tetramethylcyclotetrasiloxane or alkylsilanes such as methylsilane with a porogen, such as bicyloheptadiene (BCHD).

Nguyen et al. (U.S. Pat. No. 7,491,658) describe the use of a single organosilicon precursor with a "built-in porogen" to deposit pSiCOH films. Examples of porogens with "built-in precursors" include vinyltriethoxysilane (VTEOS), vinylmethyldiethoxysilane (VMDEOS), and multiple others. Films with k in the 2.52 to 2.6 range were deposited, but measured Young's Moduli 2.94 to 3.78 GPa, again too low for robust integration.

Gates et al. (U.S. Pat. No. 7,288,292) describe deposition of low-k films using a combination of a cyclic siloxane precursor gas, a second precursor which is a porogen, and in some embodiments, another precursor comprising molecules that contain reactive groups sensitive to e-beam radiation. As further explained, the use of reactive groups sensitive to e-beam radiation is most advantageously coupled with an eventual curing step using e-beam radiation. Examples of groups sensitive to e-beam radiation that are listed include vinyl, allyl, phenyl, and acetylenic groups. Because the purpose of the third precursor is primarily sensitization to e-beam radiation, its concentration is limited to 0.1 to about 10% of the total precursor flow. The resulting films are said to be characterized by an elastic modulus of about 5 or greater (units assumed to be GPa) for k=2.4 or less and about 3 or greater for k=2.2 or less While both these ranges are described as "better than existing low-k films", a Young's Modulus of 3 GPa is very low for practical integration.

Rhee et al. (U.S. Pat. No. 7,087,271) describe deposition of films using unsaturated organosilicon or organosilicate compounds or a combination of a saturated organosilicon or organosilicate compound with an unsaturated hydrocarbon. Combination of an unsaturated hydrocarbon with an unsaturated organosilicate is not discussed. Although dielectric constants of the resulting films were as low as 1.7 after annealing, mechanical performance was not discussed.

Sugahara et al. (U.S. Pat. No. 5,989,998) describe a method of forming an insulating film through plasma polymerization or oxidation of $R^1_x Si(OR^2)_{4-x}$ where $R^1$ is a phenyl group or a vinyl group and $R^2$ is an alkyl group. Combination with a porogen is not addressed and the lowest dielectric constant reported for the trimethoxyphenylsilane compound alone is 3.0.

Wu et al. (U.S. Pat. No. 7,241,704) describe the deposition of pSiCOH films using a precursor and a porogen, either or both of which may contain a bulky organic group in order to create the desired porosity in the film. A dielectric constant of 2.2 was achieved, but no values are given for the Young's Modulus of the film.

Afzali-Ardakani et al (US Pat. App. Pub. No. 2008/0265381) describe the use of a porous dielectric in which all of the pores have a diameter of 5 nm or less, in order to achieve improved cohesive strength at lower dielectric constant. A very extensive list of candidate precursors and a large list of porogen precursors are provided. However, O'Neill et al. (Mater. Res. Symp. Proc. 914 2006) deposited multiple films having similar dielectric constant (in the range 2.46-2.53) using different porogen precursors with the same backbone precursor (DEMS). O'Neill et al. did not observe any correlation between film porosity and the molecular volume, degree of unsaturation or other characteristic parameter of the porogen. Therefore selection of the appropriate precursor and porogen from the lists provided by Afzali-Ardakani et al to achieve the desired cohesive strength and pore size is far from obvious.

A need remains for PECVD deposition methods using well-defined precursors that lead to low-k films with desired properties, such as low dielectric constant and high Young's Modulus. Although significant know-how exists regarding low-k film deposition and the desired properties of low-k films, precursor selection to provide the desired properties in a reliable manner has remained a challenge.

SUMMARY

Disclosed herein are non-limiting embodiments of precursors and methods for their use in the manufacture of semiconductor, photovoltaic, TFT-LCD, or flat panel type devices.

In one embodiment, the disclosed method comprises providing a substrate in a reaction chamber, providing a precursor into the reaction chamber, and forming a film on the substrate by depositing at least part of the precursor onto the substrate. The disclosed precursor utilized in the method comprises a compound of the general formula $R^1_x Si(OR^2)_{4-x}$, wherein $R^1$ is an allyl group, $R^2$ is an alkyl group, and x is 1, 2, or 3. The method may include one or more of the following aspects:
  providing a porogen into the reaction chamber with the precursor;
  the precursor may be allyltrimethoxysilane and allyltriethoxysilane;
  the porogen may be BCHD or trivertal; and
  providing into the reaction chamber with the precursor and the porogen a compound selected from the group consisting of diethoxymethylsilane, dimethoxyethylsilane, hexaethoxydisilane, hexamethoxydisilane, pentaethoxymethyldisilane, and pentamethoxyethyldisilane.

In a second embodiment, the disclosed method comprises the steps of providing a reaction chamber having at least one substrate disposed therein. Greater than approximately ten percent based on total precursor flow of at least one precursor compound selected from the group consisting of vinyltrimethoxysilane, vinyltriethoxysilane, allyltrimethoxysilane, allyltriethoxysilane, vinylmethyldimethoxysilane, vinylmethyldiethoxysilane, allyldimethoxysilane, and 1,1-diethoxy-1-silacylopent-3-ene and up to approximately ninety percent based on total precursor flow of at least one porogen selected from the group consisting of BCHD and trivertal are introducing into the reaction chamber. The at least one precursor compound and the porogen are contacted with the substrate to form the low-k dielectric film on at least one surface of the substrate using a vapor deposition process. The method may include one or more of the following aspects:

between approximately 25% and approximately 75% based on total precursor flow of each of the at least one precursor compound and the at least one porogen are introduced into reaction chamber;

introducing into the reaction chamber with the precursor and the porogen a compound selected from the group consisting of diethoxymethylsilane, dimethoxyethylsilane, hexaethoxydisilane, hexamethoxydisilane, pentaethoxymethyldisilane, and pentamethoxyethyldisilane;

the vapor deposition process may be a plasma enhanced chemical vapor deposition process;

introducing into the reaction chamber with the precursor and the porogen a gas selected from the group consisting of carbon dioxide, hydrogen, oxygen, and argon;

the step of heating or curing the low-k dielectric film; and introduction of an additive gas during the curing step.

Also disclosed is a low-k dielectric film coated substrate comprising the product made by the disclosed method. The low-k dielectric film coated substrate may include one or more of the following aspects:

the low-k dielectric film may have a dielectric constant below about 2.7;
the low-k dielectric film may have a Young's modulus greater than about 5 GPa;
the low-k dielectric film may have a dielectric constant below about 2.2;
the low-k dielectric film may have a Young's modulus greater than about 4 GPa; and
the low-k dielectric film may exhibit less than approximately a 1% per day increase in dielectric constant.

NOTATION AND NOMENCLATURE

The following abbreviated terms are used throughout the description and claims.

As used herein, the abbreviation "IC" refers to integrated circuits; the abbreviation "CMP" refers to chemical mechanical polishing; the abbreviation "PECVD" refers to Plasma Enhanced Chemical Vapor Deposition; "k" and "k value" are interchangeably used to refer to the dielectric constant of a film, which are all provided relative to vacuum; the abbreviation "DEMS" refers to diethoxymethylsilane; the abbreviation "ATP" refers to alpha terpinene; the abbreviation "FTIR" refers to Fourier transform infrared spectroscopy; the term "trivertal" refers to 2,4-methyl-3-cyclohexene carboxaldehyde; the abbreviation "BCHD" refers to bicyclo-[2,2,1]-hepta-2,5-diene, which is also known as 2,5-norbornadiene; the abbreviation "VTMOS" refers to vinyltrimethoxysilane; the abbreviation "VTEOS" refers to vinyltriethoxysilane; the abbreviation "ATMOS" refers to allyltrimethoxysilane; the abbreviation "ATEOS" refers to allyltriethoxysilane; the abbreviation "VMDMOS" refers to vinylmethyldimethoxysilane; the abbreviation "VMDEOS" refers to vinylmethyldiethoxysilane; the abbreviation "ADMOS" refers to allyldimethoxysilane; the abbreviation "DMDMOS" refers to dimethyldimethoxysilane; the abbreviation "mils" refers to $1/1000$ of an inch; the abbreviation "sccm" refers to standard cubic centimeters per minute; and the abbreviation "slm" refers to standard liters per minute.

BRIEF DESCRIPTION OF THE DRAWINGS

For a further understanding of the nature and objects of the present invention, reference should be made to the following detailed description, taken in conjunction with the accompanying drawings, wherein:

FIG. 1a is a FTIR spectrum of a film deposited from VTEOS showing the effect of curing thereon.

FIG. 1b is a closer view of the 3000 cm$^{-1}$ wavenumber area of the FTIR spectrum of FIG. 1a.

FIG. 1c is a closer view of the 1000 cm–1 wavenumber area of the FTIR spectrum of FIG. 1a.

FIG. 2 is a FTIR spectrum of a film deposited from VTEOS showing the effect of aging thereon.

DESCRIPTION OF PREFERRED EMBODIMENTS

Figure 1B:
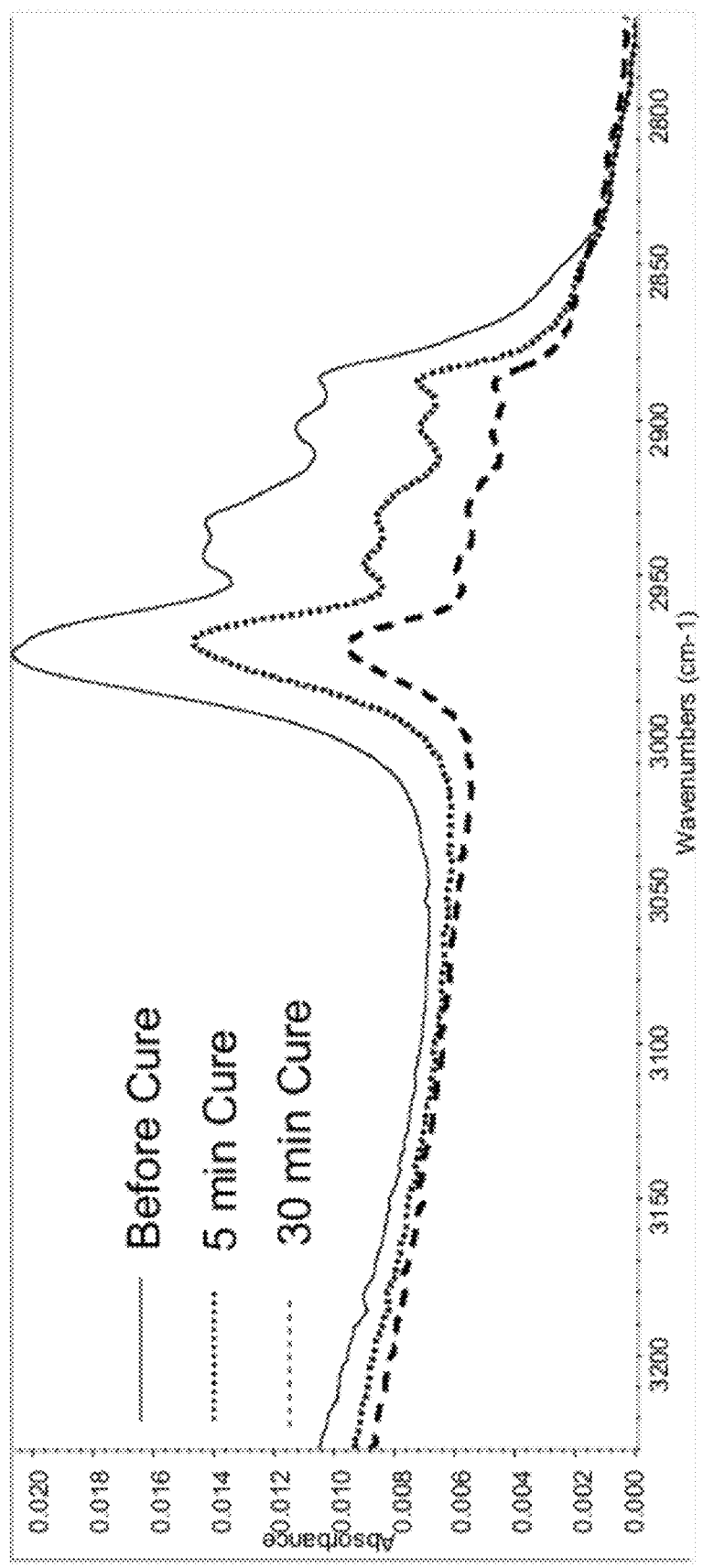

Disclosed herein are precursors that are well adapted to deposition of low-k films with significant carbon linkages by PECVD and the associated PECVD methods of deposition. The precursors and methods disclosed may be utilized in the manufacture of semiconductor, photovoltaic, TFT-LCD, and flat panel type devices.

Applicants have discovered that certain combinations of precursors are particularly well adapted to deposition of low k films with advantageous mechanical properties. Applicants hypothesize that this improvement arises because these combinations are particularly adapted to the generation of long carbon chains by polymerization. While this approach has been considered by others, the precursor combinations used in this invention are particularly and surprisingly well adapted to provide the desired properties.

Applicants propose that pSiCOH films that incorporate —[CH$_2$]$_n$-linkages in the film provide mechanical advantages over those in which hydrocarbon is present largely as —CH$_3$ directly bonded to Si. —[CH$_2$]$_n$-linkages may be directly terminated by Si atoms in the Si—O network or indirectly linked by more complex structures arising from porogens. Applicants further propose that incorporation of porosity into such films is facilitated by the use of porogens that are appropriately reactive with the selected backbone precursor.

The above is not necessarily to imply that the population of Si—CH$_3$, as may be observed by FTIR for example, is small. A pSiCOH film with low dielectric constant necessarily contains a large fraction of carbon, so that populations of —[CH$_2$]$_n$— and Si—CH$_3$ may both be significant. Applicants believe that maintaining a significant fraction of Si—CH$_3$ within the film is useful for improving the hydrophobicity of the film which in turn improves its resistance to etching by aqueous acids during cleaning steps. Maintaining a high hydrophobicity is also useful for minimizing the surface tension of aqueous films on the surface during cleaning. Reducing surface tension minimizes damage to extremely fine features that may otherwise occur during cleaning (for example collapse of closely spaced trenches with high aspect ratio).

Precursor compounds containing double bonded carbon atoms (C═C) may be used to deposit films containing Si—[CH$_2$]$_n$—Si linkages. A suitable precursor compound is $R^1_xR^2_ySi(OR^3)_{4-(x+y)}$, where $R^1$ is a vinyl or allyl group; $R^2$ is H or an alkyl group; $R^3$ is an alkyl group; x is 1, 2, or 3; and y is 0, 1, 2, or 3. This compound may be used to form an insulating film through plasma polymerization or oxidation. Examples of such compounds include vinyltrimethoxysilane (VTMOS), vinyltriethoxysilane (VTEOS), allyltrimethoxysilane (ATMOS), allyltriethoxysilane (ATEOS), vinylmethyldimethoxysilane (VMDMOS), vinylmethyldiethoxysilane (VMDEOS), allyldimethoxysilane (ADMOS), and 1,1-diethoxy-1-silacylopent-3-ene, available commercially from Gelest, Inc. In the last case, $R^1$ and $R^2$ form a cycle including a double bond that is allylic to the Si (see structure).

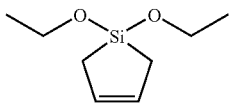

The precursor may include a low concentration (<1,000 ppm) of polymer inhibitor to prevent polymerization of the precursor during storage or heating by a vaporizer, such as hydroquinone methyl ether (MEHQ). The inhibitor reacts with trace amounts of radicals that arise in the storage vessel or vaporizer to prevent undesired polymerization resulting in precursor residues and possibly clogging of the vaporizer. A low concentration of inhibitor will generally not interfere with the reaction of the precursor in a highly energetic plasma environment.

During testing of the various embodiments disclosed in U.S. Provisional Application Ser. No. 61/093,962, Applicants have discovered that insulating films having unexpectedly low dielectric constant values and improved mechanical properties result from the combination of the precursors discussed above with a porogen, such as norbornadiene or 2,4-methyl-3-cyclohexene carboxaldehyde, also known as trivertal. Norbornadiene is a bicyclic compound with at least two strained double bonds within the same cycle. Applicants believe that the strained double bonds facilitate reaction with the precursor and polymerization of the porogen within the film. The two double bonds may serve to create a larger species by polymerization, contrary to the accepted wisdom that smaller pores and therefore a smaller porogen are desirable. When utilizing BCHD as the porogen, care should be taken to incorporate therein a polymerization inhibitor such as those disclosed by U.S. patent application Ser. No. 12/473,553, incorporated herein in its entirety by reference.

Applicants further discovered that deposition of films from the combination precursor and porogen also exhibited a more stable dielectric constant over time. Applicants believe that an increase in organic content in the film possibly results from the addition of the porogen or from the presence of Si—$CH_3$ in the precursor. The films deposited using the method disclosed herein exhibit less than approximately a 1% per day increase in dielectric constant, preferably less than approximately a 0.5% per day increase in dielectric constant, and more preferably less than approximately a 0.25% per day increase in dielectric constant.

Polymerization of the precursor compound and porogen under mild plasma conditions is expected to occur by polymerization at both the vinyl group and the Si—O linkages. Note that polymerization via the vinyl group results in a Si—$[CH_2-CH_2]_n$—Si linkage, in which n may range from 1 to a large number, even though there is no such linkage in the parent compound. The subsequent pore formation via a heating or curing step may include thermal annealing, ultraviolet (UV) treatment, plasma treatment, or electron beam treatment (as described for example in U.S. Pat. No. 7,030,468, the method of which is incorporated by reference herein in its entirety).

In some embodiments, in addition to combination with a porogen, precursors containing C=C functionality may be combined with other precursors to particularly favor formation of the desired Si—$[CH_2]_n$—Si linkage. Suitable second precursors are those with Si—H or Si—Si linkages. We expect that these precursors will react as follows:

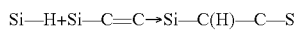

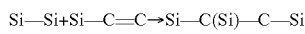

or

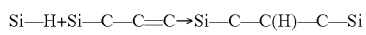

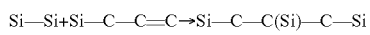

In the above equations, only the atoms and bonds actively participating in the reaction are depicted and it is to be understood that the valency of each atom in the precursor is fully satisfied by other groups, such as alkyl, alkoxy, silyl or other groups. Similarly, the valency of each atom in the film is satisfied by bonding to other atoms, primarily Si, O, C and H atoms. In a deposited film, there may be occasional dangling bonds, i.e. the valency of every atom may not be satisfied in a deposited film, especially at the film surface.

Examples of compounds containing Si—H bonds include diethoxymethylsilane (DEMS), dimethoxyethylsilane, etc. Examples of compounds including Si—Si bonds include hexaethoxydisilane, hexamethoxydisilane, pentaethoxymethyldisilane, pentamethoxyethyldisilane, etc.

The precursor, porogen, and/or Si—H/Si—Si containing compound may be used to form an insulating film on a silicon substrate, which may or may not already include other layers thereon, by deposition processes known in the art. The total flow into the PECVD chamber of the precursor, porogen, and/or Si—H/Si—Si containing compound (the "total precursor flow") may be made up as follows: at least approximately ten percent, preferably approximately 25% to approximately 75%, and more preferably approximately 40% to approximately 60% of the precursor; up to approximately ninety percent, preferably approximately 25% to approximately 75%, and more preferably approximately 40% to approximately 60% of the porogen; and from 0% to approximately 50% of the Si—H/Si—Si containing compound.

Exemplary, but non-limiting reference to the plasma enhanced chemical vapor deposition processes disclosed in U.S. Pat. Nos. 6,312,793, 6,479,110, 6,756,323, 6,846,515, 6,953,984, 7,030,468, 7,049,247, 7,202,564, 7,282,458, 7,288,292, 7,312,524, 7,521,377 and U.S. Pat. App. Pub. No. 2007/0057235 is incorporated herein by reference. The precursor may be used in combination with an added porogen, as described in U.S. Pat. Nos. 6,312,793, 6,479,110, 7,030,468 and 7,282,458, or in combination with an added porogen and Si—H/Si—Si containing compound, as described in U.S. Pat. No. 7,288,292. In each case, post-treatment to form pores may include thermal annealing, ultraviolet (UV) treatment, plasma treatment, or electron beam treatment (as described for example in U.S. Pat. No. 7,030,468). Any of the above post-treatment methods, but especially UV treatment, has been found effective to increase cross-linking of the film by converting residual SiOC and SiOH linkages to SiOSi. This in turn tends to improve the mechanical strength of the film. In addition, post treatment, and particularly, UV curing has been found effective for removal of residual organic material, leading to the creation of pores and a decrease in dielectric constant.

For example, it is anticipated that, in the method disclosed of forming a layer of carbon-doped silicon oxide on a substrate in U.S. Pat. No. 7,202,564, the precursors disclosed herein may replace the cyclic or non-cyclic organosilicon compounds mentioned (which include as examples octamethylcyclotetrasiloxane, dimethyldimethoxysilane, etc.)

The silicon substrate, which may or may not include additional layers, is placed in the reaction chamber of a vapor deposition tool. The precursor used to form the low-k dielectric film may be delivered as a liquid vaporized directly within the reactor, or transported by an inert carrier gas including, but not limited to, helium or argon. The porogen and Si—H/Si—Si containing compound (if selected) may be similarly delivered, as described in the art (see above references).

Preferably, the precursor is vaporized at a temperature chosen so as to provide sufficient vapor pressure of the precursor while avoiding its decomposition. The precursors disclosed herein are generally volatile and easily delivered to a process chamber. Optionally, the precursor may be dissolved in a suitable solvent to facilitate its evaporation. Suitable solvents include hydrocarbons such as hexane, octane, etc. For the precursors disclosed herein, a solvent is not generally required to facilitate evaporation but may be used to adjust the precursor concentration in the chamber or increase the hydrocarbon concentration. Alternatively, prior to vaporization, the precursor may be mixed with the Si—H/Si—Si containing compound such as dimethyldimethoxysilane, diethoxymethylsilane, tetramethylsilane, octamethylcyclotetrasiloxane, etc. In this case both the precursor and the Si—H/Si—Si containing compound will contribute to film formation.

Additional gases may be delivered to the chamber in order to adjust the oxidizing power or other properties of the plasma. Benefits of this addition may include a more stable discharge (reduced arcing), improved uniformity, faster deposition rate, and/or improved Young's Modulus of the resulting film. Preferably, a low flow of oxygen, in the range 0 to 30 sccm is added. Oxygen flow in excess of 50 sccm is usually undesirable as it may lead to formation of Si—OH on the dielectric surface, and therefore water absorption and a higher dielectric constant. These flow guidelines are appropriate for the apparatus described in the Examples and may require modification for application to other apparatuses. In place of oxygen, a flow of $CO_2$ may be substituted and may be less damaging to the dielectric. Likewise, addition of a low flow of Argon has been found helpful on occasion to obtain a faster deposition rate and more uniform films.

The low-k dielectric layer will be deposited upon a silicon substrate, which may include one or more layers thereon prior to deposition of the low-k dielectric layer, depending on the final use intended. In some embodiments, the substrate may include doped or undoped silicon optionally coated with a silicon oxide layer, in addition to oxides which are used as dielectric materials in MIM, DRAM, FeRam technologies or gate dielectrics in CMOS technologies (for example, $SiO_2$, SiON, or $HfO_2$ based materials, $TiO_2$ based materials, $ZrO_2$ based materials, rare earth oxide based materials, ternary oxide based materials, etc.), and metals that are used as conducting materials in such applications, such as for example, tungsten, titanium, tantalum, ruthenium, or copper. In other embodiments, the substrate may include copper interconnects and insulating regions, such as another low-k material, optionally coated with a sealing layer such as $SiO_2$ or SiN. Other examples of layers upon which the insulating film may be coated include, but are not limited to, solid layers such as metal layers (for example, Ru, Al, Ni, Ti, Co, Pt and metal silicides, such as $TiSi_2$, $CoSi_2$, and $NiSi_2$); metal nitride containing layers (for example, TaN, TiN, WN, TaCN, TiCN, TaSiN, and TiSiN); semiconductor materials (for example, Si, SiGe, GaAs, InP, diamond, GaN, and SiC); insulators (for example, $SiO_2$, $Si_3N_4$, $HfO_2$, $Ta_2O_5$, $ZrO_2$, $TiO_2$, $Al_2O_3$, and barium strontium titanate); or other layers that include any number of combinations of these materials. The actual layers utilized will also depend upon the low-k dielectric layer utilized.

The precursor and porogen are introduced into the film deposition chamber and contacted with the substrate to form a low-k dielectric layer on at least one surface of the substrate. The film deposition chamber may be any enclosure or chamber of a device in which deposition methods take place, such as, without limitation, a parallel plate-type reactor, a cold-wall type reactor, a hot-wall type reactor, a single-wafer reactor, a multi-wafer reactor, or other such types of deposition systems.

The reaction chamber may be maintained at a pressure ranging from about 0.5 mTorr to about 20 Torr, and preferably less than 10 Torr. In addition, the temperature within the reaction chamber may range from about 25° C. to about 600° C. One of ordinary skill in the art will recognize that the temperature may be optimized through mere experimentation to achieve the desired result.

The substrate may be heated to a sufficient temperature to obtain the desired insulating film at a sufficient growth rate and with desired physical state and composition. A non-limiting exemplary temperature range to which the substrate may be heated includes from 25° C. to 600° C. Preferably, the temperature of the substrate remains less than or equal to 350° C.

Based upon the theoretical mechanism and the dielectric properties of films formed from organosilane compounds, it is believed that the layers deposited using the above precursors will have a dielectric constant below about 3, preferably below about 2.5, and even more preferably below about 2.2.

As mentioned above and discussed in more detail in the incorporated prior art, the low-k dielectric layer may be rendered porous by a subsequent heating or curing step to further reduce the dielectric constant and increase the mechanical strength of the insulating layer, usually before any additional layers are deposited. A suitable heating or curing step may include, but is not limited to, annealing, UV light, or electron beam. It is believed that the resulting porous film will preferably exhibit a dielectric constant below about 2.7 and a Young's modulus greater than about 5 GPa, and more preferably a dielectric constant below about 2.2 and a Young's modulus greater than about 4 GPa.

Optionally, an additive gas may be introduced during curing. For example hydrogen may be introduced to help ensure that remaining unsaturated bonds in the film become fully saturated, a hydrocarbon may be introduced for the same purpose or to ensure that an adequate fraction of hydrocarbons remains in the film after curing. Alternatively oxygen may be introduced to increase hydrocarbon removal. As removal of water has been shown to be an important function of curing, water reactive molecules may be added, for example hexafluoracetylacetone. Silylating agents may be added if needed to remove Si—OH groups from the film. Suitable silylating agents include but are not limited to hexamethyl disilazane, trimethylsilyl dimethyl amine, trimethylsilyl imidazole. trimethylsilyl isocyanate, trimethylethoxysilane and trimethylmethoxysilane.

Based on the disclosure herein, the references incorporated herein, and teachings well known to those skilled in the art, one of ordinary skill in the art would be able to easily select appropriate values for the process variables controlled during deposition of the low-k films, including RF power, precursor mixture and flow rate, pressure in reactor, and substrate temperature.

EXAMPLE

The following example illustrates experiments performed in conjunction with the disclosure herein. The examples are not intended to be all inclusive and are not intended to limit the scope of disclosure described herein.

Comparative Example 1

A series of films deposited with vinyltriethoxysilane (VTEOS) alone on 8" wafers in an Applied Materials P5000 deposition tool equipped with a DxZ deposition chamber and TEOS kit. The following range of conditions was examined: power 100-200 W, substrate temperature 260° C., pressure 2-6 torr, spacing 325 mils, oxygen flow 0-50 sccm, argon flow 0-50 sccm, VTEOS flow 250-750 mg/min (mass flow controller TEOS calibrated), and helium flow 500-1000 sccm. "Spacing" refers to the separation between the susceptor, on which the wafer rests, and the "showerhead", which is the upper electrode through which gases are introduced. The best conditions found were: power 200 W, substrate temperature 260° C., pressure 6 torr, spacing 325 mils, oxygen flow 0 sccm, argon flow 50 sccm, VTEOS flow 750 mg/min, helium flow 1000 sccm. Films were deposited using these parameters for 60 seconds each, with resulting thicknesses ranging from 1402 to 1473 A. The dielectric constant k was measured at 3.19-3.27 as deposited. Film thickness was determined by spectroscopic ellipsometry and dielectric constant was measured using a mercury probe.

After deposition, the films were cured in a separate custom chamber (also based on a DxZ chamber)—modified to include a fused silica window in the chamber lid and a UV lamp irradiating the wafer through the window. Films were cured for 30 minutes under 1 torr pressure, nitrogen flow at 1 slm, and a susceptor temperature of 400° C. The dielectric constant of the films after curing was reduced to an average of 2.96.

VTEOS has been mentioned as an example of a molecule with a built-in porogen by Nguyen (U.S. Pat. No. 7,491,658) and the reduction in k observed on curing the films produced by VTEOS supports this view. However, even after curing, the k-values obtained are comparable to those obtained with conventional precursors, such as reported in U.S. Pat. No. 6,583,048 (k of 2.90 to 3.06 with DEMS).

Comparative Example 2

Transmission FTIR spectra were collected on samples of films deposited using VTEOS as in Comparative Example 1. In order to ensure good transmission of IR light through the substrate, the films were deposited on silicon wafers with a resistivity >8 ohm-cm. In Comparative Example 1, silicon wafers with a resistivity <0.02 ohm-cm were used to enable more accurate k-measurement. The resulting film spectra are shown in FIGS. 1a-1c.

FIG. 1b illustrates the C—H stretching region close to wavenumber 3000 cm$^{-1}$. The spectra demonstrate that hydrocarbons are removed by curing for 5 minutes with the UV source and further removed when curing is extended to 30 minutes. Wu (U.S. Pat. No. 7,241,704) observed similar behavior in this region on curing their films.

FIG. 1c illustrates the Si—C and Si—O—Si stretch regions. The peak at about 1270 cm$^{-1}$ is attributed to Si—CH$_3$. On curing, absorption in the 1100-1150 cm$^{-1}$ region decreases, which is tentatively attributed to a decrease in cage linkages of Si—O—Si in favor of network linkages, while the peak at 1270 cm$^{-1}$ increases, indicating an increase in Si—CH$_3$. In contrast to the C—H stretching region (FIG. 1b), here our results do not agree with Wu, who observed a decrease in Si—CH$_3$. Wu's films were deposited using DEMS, which illustrates that the precursor used can influence the resulting film significantly. Applicants hypothesize that the absence of Si—CH$_3$ in VTEOS results in a film which is relatively deficient in Si—CH$_3$, but that Si—CH$_3$ grows on UV exposure. On the other hand, a film deposited with DEMS is relatively rich in Si—CH$_3$, and thus Si—CH$_3$ decreases with UV exposure.

Comparative Example 3

A deterioration of the dielectric constant of the films deposited using VTEOS was observed with aging. In order to understand this phenomenon, the aging of a film deposited using a relatively high flow of oxygen (50 sccm) was examined. The film was deposited and cured according to Comparative Example 1. A dielectric constant of 3.7 was observed immediately after curing. After 3 days, the dielectric constant had increased to 5.1, and after 6 days, to 5.6.

For comparison, a film deposited using no oxygen flow (0 sccm) showed a dielectric constant of 3.0 immediately after curing, which increased to 3.2 after 3 days. In other words, the increase was much less for the no oxygen flow sample.

FIG. 2 shows the FTIR spectrum in the 3000-4000 cm$^{-1}$ region for the uncured high O$_2$ flow sample, the same sample after curing, and the same sample after 3 days. Hydrocarbon removal on curing is visible, as in Comparative Example 2. A large signal due to absorbed H$_2$O in the 3000-3500 cm$^{-1}$ region is also visible. This signal is attributed to absorption on surfaces rich in Si—OH groups. Curing removes a large fraction of the absorbed water, however on aging it is seen that water reabsorbs.

For samples with lower k values, the absorbed water signal was too weak to observe clearly by FTIR. However, Applicants hypothesize that the same mechanism, on a smaller scale, is responsible for the increase in dielectric constant on aging for those films as well. It is well known that oxygen present in a plasma environment favors formation of Si—OH and hence water absorption of the resulting film.

Comparative Example 4

As mentioned above, a film deposited using VTEOS showed an increase in dielectric constant from 2.96 to 3.19 over 3 days, i.e. a rate of 2.6% per day. Modifying the deposition parameters by adding 50 sccm argon had no effect on the initial k after curing, but reduced the rate of increase of k to 1.2% per day.

Example 1

A series of films were deposited using the combination of VTEOS and BCHD on 8" wafers with the same deposition tool of Comparative Example 1. The flow of VTEOS is controlled with a mass flow controller that was TEOS calibrated and the flow of BCHD is controlled with a mass flow controller that was BCHD calibrated. For each film, the deposition time was 30 seconds.

After deposition, the films were cured in the same curing tool of Comparative Example 1. Films were cured for 30 minutes, but shorter curing times may work equally well. Curing conditions were 1 torr nitrogen at 1 slm flow, with a susceptor temperature of 400° C. Deposition conditions, measured film thickness, and measured dielectric constant are summarized in the table below. Dielectric constant values before curing were in the range 2.73 to 3.61, with the reduction on curing in the range 0.21-0.68.

| Temperature (C.) | Pressure (Torr) | Power (W) | Spacing (mils) | VTEOS (mgm) | BCHD (mgm) | He-1 VTEOS (sccm) | He-2 (BCHD) (sccm) | O2 (sccm) | Ar (sccm) | Thickness (A) | refractive index | K (film) |
|---|---|---|---|---|---|---|---|---|---|---|---|---|
| 260 | 4 | 150 | 275 | 300 | 500 | 750 | 750 | 50 | 50 | 408 | 1.634 | 2.80 |
| 260 | 4 | 150 | 500 | 750 | 500 | 350 | 750 | 0 | 0 | 305 | 1.440 | 2.33 |
| 260 | 4 | 300 | 500 | 300 | 300 | 350 | 350 | 0 | 50 | 763 | 1.433 | 2.59 |
| 260 | 4 | 300 | 275 | 750 | 300 | 750 | 350 | 50 | 0 | 2291 | 1.456 | 3.05 |
| 260 | 8 | 150 | 275 | 300 | 500 | 750 | 350 | 0 | 50 | 272 | 1.517 | 2.52 |
| 260 | 8 | 150 | 500 | 750 | 500 | 350 | 350 | 50 | 0 | 2053 | 1.392 | 2.63 |
| 260 | 8 | 300 | 500 | 300 | 300 | 350 | 750 | 50 | 50 | 1823 | 1.485 | 2.71 |
| 260 | 8 | 300 | 275 | 750 | 300 | 750 | 750 | 0 | 0 | 1420 | 1.427 | 2.48 |
| 300 | 4 | 150 | 275 | 750 | 300 | 350 | 750 | 50 | 50 | 931 | 1.431 | 3.29 |
| 300 | 4 | 150 | 500 | 300 | 300 | 750 | 750 | 0 | 0 | 320 | 1.504 | 2.55 |
| 300 | 4 | 300 | 500 | 750 | 500 | 750 | 350 | 0 | 50 | 741 | 1.399 | 2.70 |
| 300 | 4 | 300 | 275 | 300 | 500 | 350 | 350 | 50 | 0 | 2005 | 1.567 | 2.93 |
| 300 | 6 | 225 | 325 | 500 | 400 | 500 | 500 | 50 | 0 | 1556 | 1.450 | 2.77 |
| 300 | 8 | 150 | 275 | 750 | 300 | 350 | 350 | 0 | 50 | 406 | 1.400 | 2.46 |
| 300 | 8 | 150 | 500 | 300 | 300 | 750 | 350 | 50 | 0 | 1031 | 1.431 | 2.78 |
| 300 | 8 | 300 | 500 | 750 | 500 | 750 | 750 | 50 | 50 | 2206 | 1.389 | 2.55 |
| 300 | 8 | 300 | 275 | 300 | 500 | 350 | 750 | 0 | 0 | 939 | 1.495 | 2.66 |

Example 2

The data obtained in Example 1 were utilized to determine best fit parameters in a simple design-of-experiments model assuming linear dependencies and no interactions. This model then provided the best deposition conditions within the range evaluated in Example 1, which was as follows: deposition temperature 260° C., pressure 8 torr, power 150 W, spacing 500 mils, VTEOS flow 750 mg/min, BCHD flow 500 mg/min, both helium flows 750 sccm, oxygen flow 0 sccm, and argon flow 0 sccm. A film was deposited using these conditions and a 3 minute deposition time. The film was then cured for 30 minutes. This resulted in a film thickness of 1460 A and a dielectric constant of 2.31. These conditions could be further optimized, by varying deposition parameters over a smaller range closer to the optimum.

Following wet cleaning of the deposition chamber with de-ionized water and isopropanol, the test of Example 2 was repeated, but with a deposition time of five minutes. The resulting film had a dielectric constant of 2.12 and a thickness of 3,336 A.

Example 3

In a manner similar to Example 1, a series of films were deposited using vinylmethyldiethoxysilane (VMDEOS) and BCHD. The flow of VMDEOS is controlled with a mass flow controller that was DMDMOS calibrated and the flow of BCHD is controlled with a mass flow controller that was BCHD calibrated. The range of k values before curing was 2.58 to 3.14 with a decrease on curing from zero to 0.49. Using these results to build a model in the manner of Example 2 indicated that k=2.2 or lower is achievable with this molecule.

| Temperature (C.) | Pressure (Torr) | Power (W) | Spacing (mils) | VMDEOS (mgm) | BCHD (mgm) | He-1 VMDEOS (sccc) | He-2 (BCHD) (sccm) | O2 (sccm) | Thickness (A) | refractive index | k |
|---|---|---|---|---|---|---|---|---|---|---|---|
| 260 | 4 | 100 | 500 | 750 | 750 | 350 | 750 | 0 | 161 | 1.463 | 2.42 |
| 260 | 4 | 100 | 500 | 750 | 350 | 350 | 30 | 372 | 1.492 | 2.49 | |
| 260 | 4 | 250 | 275 | 750 | 300 | 750 | 750 | 0 | 812 | 1.482 | 2.71 |
| 260 | 4 | 250 | 275 | 750 | 300 | 750 | 350 | 30 | 1207 | 2.575 | 3.05 |
| 260 | 6 | 225 | 325 | 500 | 400 | 500 | 500 | 15 | 1183 | 1.444 | 2.57 |
| 260 | 8 | 100 | 275 | 300 | 750 | 750 | 750 | 30 | 275 | 1.624 | 2.67 |
| 260 | 8 | 100 | 275 | 300 | 750 | 750 | 350 | 0 | 139 | 1.609 | 2.56 |
| 260 | 8 | 250 | 500 | 300 | 300 | 350 | 750 | 30 | 1076 | 1.402 | 2.47 |
| 260 | 8 | 250 | 500 | 300 | 300 | 350 | 350 | 0 | 577 | 1.449 | 2.50 |
| 300 | 4 | 100 | 500 | 300 | 300 | 750 | 750 | 0 | 307 | 1.546 | 2.60 |
| 300 | 4 | 100 | 500 | 300 | 300 | 750 | 350 | 30 | 326 | 1.507 | 2.41 |
| 300 | 4 | 250 | 275 | 300 | 750 | 350 | 750 | 0 | 501 | 1.622 | 2.68 |
| 300 | 4 | 250 | 275 | 300 | 750 | 350 | 350 | 30 | 1113 | 1.542 | 2.68 |
| 300 | 8 | 100 | 275 | 750 | 300 | 350 | 750 | 30 | 618 | 1.353 | 2.48 |
| 300 | 8 | 100 | 275 | 750 | 300 | 350 | 750 | 0 | 181 | 1.385 | 2.48 |
| 300 | 8 | 250 | 500 | 750 | 750 | 750 | 750 | 30 | 734 | 1.395 | 2.38 |
| 300 | 8 | 250 | 500 | 750 | 750 | 750 | 350 | 0 | 398 | 1.459 | 2.38 |

Example 4

Films deposited using VTEOS with BCHD were found to provide not only a lower k value compared to those with VTEOS alone, but also, unexpectedly, proved more resistant to aging. Thus a film which provided k=2.12 immediately after deposition increased to only 2.27 after 19 days, an average rate of 0.4%/day (compared to the 1.2% best case without BCHD of Comparative Example 4). Films deposited using VMDEOS+BCHD showed yet further resistance to aging with aging rates of 0.12%/day and 0.22%/day. These improvements are attributed to increasing organic content of the film due to the incorporation of BCHD and, in the case of VMDEOS, to the presence of Si—$CH_3$ in the molecule.

Example 5

In order to evaluate the mechanical performance of the deposited films, their Young's Modulus was determined by nanoindentation. In order to achieve representative measurements, each film was more than 1 micron thick, and Young's Modulus was determined by averaging data obtained at an indentation depth of 100 nm. Thus the indentation depth was less than 10% of the film thickness. This indentation depth is selected in order to eliminate the effects of the substrate. The Young's Modulus determined at this depth for each sample was generally its minimum value. At shallower depths, a slight increase in Young's Modulus was observed, attributed to oxidation of the film surface, while at greater depths the Young's Modulus was the same or slightly higher than at 100 nm, due to substrate effects.

For three films deposited using VTEOS and BCHD, Young's Modulus and k were as follows: Film with k=2.41 had Young's Modulus of 5.5 GPa, film with k=2.30 had Young's Modulus of 5.3 GPa, film with k=2.0 had Young's Modulus=4 GPa. Aging of the two films with k=2.30 and 2.41 was as indicated for VTEOS+BCHD films in Example 4. However, the film with k=2.0 showed more rapid aging, averaging 1.3%/day. Based on the data of Examples 3 and 4, it is expected that VMDEOS will provide more stable films at such low k values.

Figure 3:
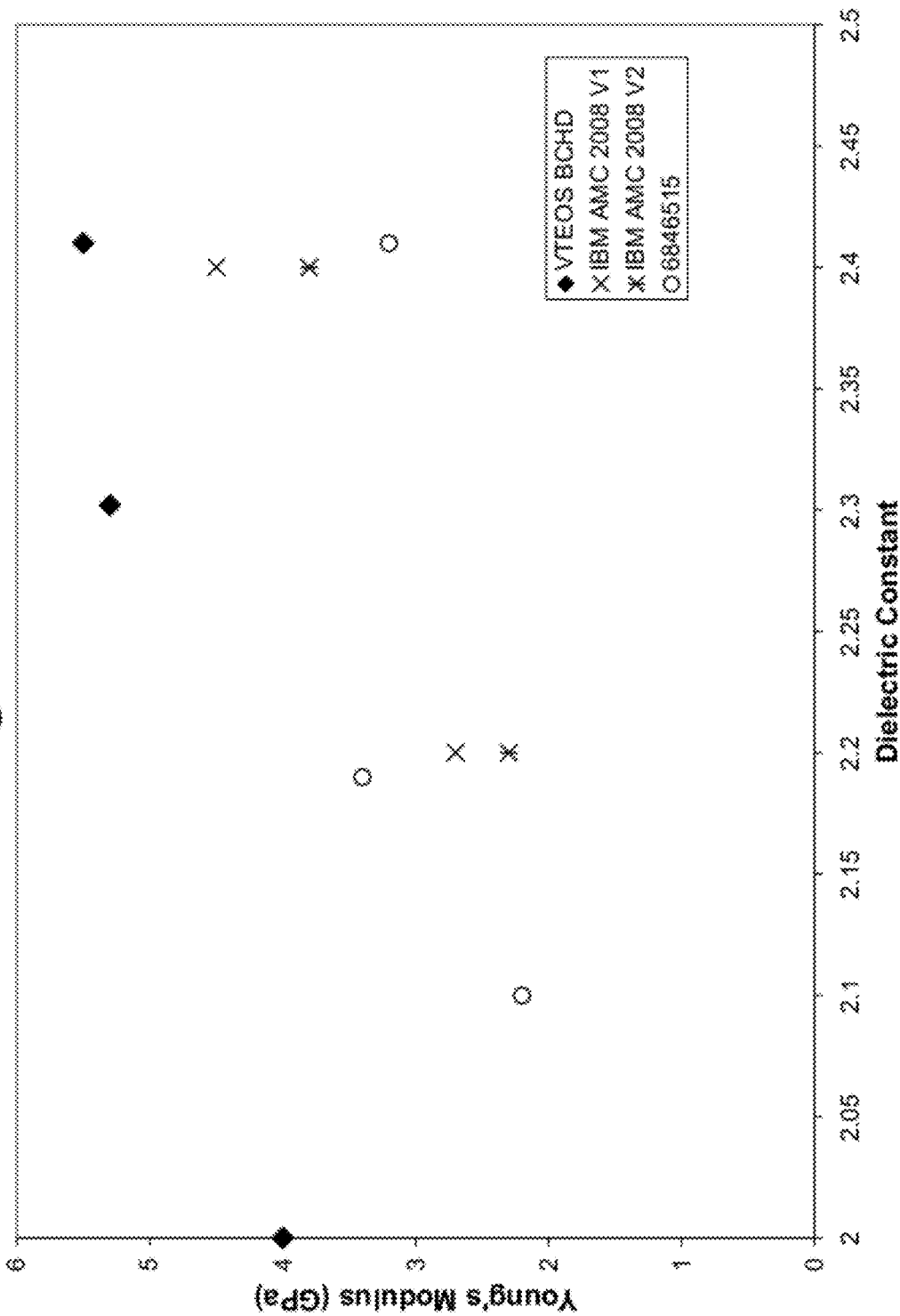
FIG. 3 is graph comparing the Young's Modulus and dielectric constant values for prior art films with those of films resulting from the deposition of VTEOS and BCHD.

Compared with the prior art, the above Young's Modulus results represent a significant improvement. FIG. 3 compares these results with data from U.S. Pat. No. 7,384,471 (Vrtis et al.) and data presented at the Advanced Metallization Conference in 2008 (AMC 2008). The U.S. Pat. No. 7,384,471 data was obtained using di-t-butoxymethylsilane with alpha-terpinene as porogen. The data from AMC 2008 represent the state-of-the art solution presented by IBM for next generation semiconductor manufacturing. While the identity of the precursors used by IBM was not explicitly revealed in 2008, it has since been stated publicly (at the Materials Research Society Meeting in 2009) that the material referred to as "V1" was deposited with diethoxymethylsilane (DEMS), using BCHD as porogen, and the material referred to a "V2" was deposited with DEMS, BCHD, and an additional to date unnamed component. Other examples of low-k films may be cited for comparison but those shown here are believed to represent the state of the art outside the present invention. In comparing with other results, it must be noted that thin films are commonly used and give nanoindentation results that are falsely high due to substrate effects.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of forming a low-k dielectric film on a substrate, the method comprising the steps of:
providing a reaction chamber having at least one substrate disposed therein;
introducing into the reaction chamber between approximately 25% and approximately 75% based on total precursor flow in mg/min of at least one precursor compound selected from the group consisting of vinyltrimethoxysilane, vinyltriethoxysilane, allyltrimethoxysilane, allyltriethoxysilane, vinylmethyldimethoxysilane, vinylmethyldiethoxysilane, allyldimethoxysilane, and 1,1-diethoxy-1-silacyclopent-3-ene;
introducing into the reaction chamber between approximately 25% and approximately 75% based on total precursor flow in mg/min of at least one porogen selected from the group consisting of BCHD and trivertal;
contacting the at least one precursor compound and the porogen with the substrate to form the low-k dielectric film on at least one surface of the substrate using a vapor deposition process; and
heating or curing the low-k dielectric film to form a low-k dielectric film with a dielectric constant below about 2.7 and a Young's modulus greater than about 4 GPa.

2. The method of claim 1, further comprising introducing into the reaction chamber with the precursor and the porogen a compound selected from the group consisting of diethoxymethylsilane, dimethoxyethylsilane, hexaethoxydisilane, hexamethoxydisilane, pentaethoxymethyldisilane, and pentamethoxyethyldisilane.

3. The method of claim 1, wherein the vapor deposition process is a plasma enhanced chemical vapor deposition process.

4. The method of claim 3, further comprising introducing into the reaction chamber with the precursor and the porogen a gas selected from the group consisting of carbon dioxide, hydrogen, oxygen, and argon.

5. The method of claim 3, further comprising introduction of an additive gas during the curing step.

6. A low-k dielectric film coated substrate comprising the product made by the method of claim 1.

7. The low-k dielectric film coated substrate of claim 6, wherein the low-k dielectric film has a Young's modulus greater than about 5 GPa.

8. The low-k dielectric film coated substrate of claim 6, wherein the low-k dielectric film has a dielectric constant below about 2.2.

* * * * *